United States Patent [19]
Williams et al.

[11] Patent Number: 5,982,697
[45] Date of Patent: *Nov. 9, 1999

[54] METHOD FOR INITIALIZING AND REPROGRAMMING A CONTROL OPERATION FEATURE OF A MEMORY DEVICE

[75] Inventors: Brett Williams, Eagle; Scott Schaefer, Boise, both of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 09/045,608

[22] Filed: Mar. 20, 1998

Related U.S. Application Data

[63] Continuation of application No. 08/759,337, Dec. 2, 1996, Pat. No. 5,757,715.

[51] Int. Cl.⁶ ..................................................... G11C 8/00
[52] U.S. Cl. ................................. 365/230.03; 365/189.05; 365/222; 365/233; 365/191
[58] Field of Search ......................... 365/230.01, 230.03, 365/189.01, 189.05, 222, 233, 191

[56] References Cited

U.S. PATENT DOCUMENTS

| 4,173,041 | 10/1979 | Dvorak et al. ........................... 364/200 |
|---|---|---|
| 4,394,753 | 7/1983 | Penzel ...................................... 365/236 |
| 4,742,474 | 5/1988 | Knierim ................................... 345/187 |
| 4,745,546 | 5/1988 | Grinberg et al. ....................... 364/200 |
| 4,920,483 | 4/1990 | Pogue et al. ........................... 364/200 |
| 4,939,391 | 7/1990 | Young et al. ........................... 307/465 |
| 4,992,956 | 2/1991 | Kaku et al. .............................. 364/519 |
| 5,016,162 | 5/1991 | Epstein et al. .......................... 364/200 |
| 5,027,005 | 6/1991 | Kitsuta et al. .......................... 327/197 |
| 5,222,221 | 6/1993 | Houri et al. ............................. 395/375 |
| 5,263,003 | 11/1993 | Cowles et al. ........................ 365/230.03 |
| 5,353,431 | 10/1994 | Doyle et al. ........................... 395/425 |
| 5,386,385 | 1/1995 | Stephens, Jr. ...................... 365/189.05 |
| 5,414,833 | 5/1995 | Hershey et al. ........................ 395/575 |
| 5,587,961 | 12/1996 | Wright et al. ........................... 365/233 |
| 5,600,605 | 2/1997 | Schaefer ................................. 365/233 |
| 5,636,173 | 6/1997 | Schaefer ............................. 365/230.03 |
| 5,717,639 | 2/1998 | Williams et al. ................... 365/189.05 |
| 5,757,715 | 5/1998 | Williams et al. ................... 365/230.03 |
| 5,812,842 | 9/1998 | Williams et al. ...................... 395/653 |

OTHER PUBLICATIONS

"Micron Technology, Inc.", 1993 DRAM Data Book.

*Primary Examiner*—Viet Q. Nguyen
*Attorney, Agent, or Firm*—Schwegman, Lundberg Woessner & Kluth P.A.

[57] ABSTRACT

A method for initially programming a synchronous dynamic random access memory (SDRAM) device to have a first control operating option in response to a first command and for reprogramming the SDRAM device to have a second control operating option in response to a second command.

2 Claims, 13 Drawing Sheets ated, also known as alternate names RAS* will remain active and the

METHOD FOR INITIALIZING AND REPROGRAMMING A CONTROL OPERATION FEATURE OF A MEMORY DEVICE

CROSS REFERENCE TO RELATED APPLICATION

This application is a continuation of U.S. application Ser. No. 08/759,337, filed Dec. 2, 1996 now U.S. Pat. No. 5,757,715. This application is being filed simultaneously with copending application having disclosure number 92-546 entitled "A MEMORY DEVICE HAVING CIRCUITRY FOR INITIALIZING AND REPROGRAMMING A CONTROL OPERATION FEATURE".

FIELD OF THE INVENTION

The invention relates to random access memory devices, and more particularly to circuitries and methods for initializing and reprogramming a programmable control operation feature of the a synchronous dynamic random access memory device to a desired control operating option.

BACKGROUND OF THE INVENTION

The following background information describes the MT48LC2M8S1, a 16 Meg synchronous dynamic random access memory (SDRAM) organized in a x8 configuration. The MT48LC2M8S1 is structured internally as a dual 1 Meg x8 SDRAM with synchronous interfacing and control logic. A dual 1 Meg x8 SDRAM has two banks, each bank comprises 8 memory arrays, and each memory array has 1 Meg (1,048,576) memory cells arranged in a matrix of electrical intersections of rows and columns. SDRAMs offer substantial advances in dynamic memory operating performance.

Two key advancements of the SDRAM are its ability to synchronously burst data at a high-speed data rate, via automatic column address generation, and to interleave between the internal banks hiding precharge time. The interleaving between two open banks increases the probability of "page-hits". The interleaving between open banks coupled with the high speed burst mode may, in many cases, provide a "seamless" flow of data.

When accessing the SDRAM, control circuitry is cycled in order to access one of the internal banks of memory. A typical synchronous design provides optimal memory performance in low voltage (typically 3.3V) memory systems. All input and output signals, with the exception of the clock enable (CKE) signal, are synchronized to the system's clock. The positive going edge of the system clock (CLK) provides the registering trigger which synchronizes the SDRAM.

The SDRAM has several programmable control operation features. The SDRAM must first be initialized and have its mode register set in order for the each programmable control operation feature to function according to a desired control operating option, also referred to as control operating mode. Once the mode register is set, the SDRAM may be accessed.

Each byte is uniquely accessed by registering the 11 row-address bits (A0–A10) via the Active command, followed by registering the 9 column-address bits (A0–A8) via a READ or WRITE command. Internal bank selection is controlled by a bank activate (BA) signal during both row address strobe (RAS) and column address strobe (CAS) registration which allows the bank to be accessed in order that a read/write operation may be performed to the bank. This bank selection is also called activation of the bank. The bank selected is referred to as an active or activated bank.

The SDRAM requires separate commands for accessing and precharging a row. Once a row is clocked into the SDRAM the bank becomes active and remains active. That is, the internally generated RAS* will remain active and the selected row will remain open until it is commanded to precharge via the precharge command. Throughout this specification letters which have the asterisk, such as RAS*, refer to the corresponding signal is RAS. Accidentally accessing another row in the same bank while the previous row is still active is not allowed and will result in deterioration of the memory's data in the bank being violated.

SDRAMs must be powered-up and initialized in a predefined manner. Operational procedures other than what is specified could produce unwanted and unrepeatable startup modes. Once power, $V_{CC}$ and $V_{OOQ}$, is simultaneously applied to core logic and DQ buffer power pins, respectively, the SDRAM requires a 100 micro second delay prior to any signals being toggled. It is recommended that all the inputs be held HIGH during this phase of powering-up.

It must be assumed that the SDRAM will power-up with its mode register in an unknown state. During initialization the signals on DQ pins are used as inputs to programming circuitries. There is a programming circuit for each programmable control operation feature and the programming circuitry programs the SDRAM for the desired control operating option in response to the mode register outputs. Thus, prior to performing any operational command, the SDRAM must have its mode register set.

The mode register is a persistent register. That is, once it is set, the data is latched to its outputs until it is reset or the device loses power.

FIG. 1 is a portion of SDRAM circuitry of the related art and comprises a mode register 3 programmed by providing an op-code, via the address inputs A0–A10, and ABA on address bus 5, in conjunction with a set mode register command generated in master control circuit 7. The mode register 3 is comprised of 11 D flip flop circuits which latch the op-code to the mode register output nodes on the positive going edge of the system clock when the mode register is enabled by the set mode register command. Programming circuits 8 select a control operating option for each programmable control operation feature of the SDRAM.

In FIG. 2 the control operating options of each programmable control operation feature are displayed in relation to the op-code 9 used to generate the desired control operating option. The op-code 9 is represented by bits MHz $0$–$M_{11}$. The programmable control operation features are burst length, burst type, and read latency and are shown in charts 10, 15, and 20, respectively. Other programmable control operation features are shown in chart 25. The programmable control operation features shown in charts 10, 15, and 20 are joint electron device engineering counsels (JEDEC) standards. The other programmable control operation features shown in chart 25 are vendor and application specific, except for "test mode entry" which is an agreed upon JEDEC standard.

The control operating option selected for the read latency feature shown in chart 20 is determined by the op-code M4 through M6; the sequential control operating option or the interleave operating option of the burst type feature, shown in chart 15, is determined by bit M3; and the operation option of the burst length feature, shown in chart 10 is determined by bits $M_0$ through $M_2$.

FIG. 3 is a block schematic of the related art showing the SDRAM MT48LC2M8S1, also described in the 1993 DRAM data book, published by Micron Technology herein incorporated by reference. The set mode register command is accomplished by registering chip select* (CS*), row access strobe* (RAS*), column address strobe* (CAS*) and write enable* (WE*) LOW during the idle state. The idle state occurs when all internal RAS signals are inactive, typically high. The set mode register command is generated in the master control circuit 19. The mode register command, the system clock, and the op-code on address input pins A0–A10 and BA are all received by the mode register 21.

Read latency is a programmable control operation feature defined by the op-code on address input pins A4–A6 in conjunction with the set mode register command. Address bits A4 through A6 define the number of clock cycles the data-out will be delayed or offset from its corresponding CAS registration during a READ cycle. Latencies of 1,2, or 3 clocks are available as shown in chart 20 of FIG. 2. The read latency guarantees on which clock the data will be available, regardless of clock rate (TCK).

Burst type is a programmable control operation feature defined by the op-code on address input pin A3 in conjunction with the set mode register command. Address input bit A3 defines which burst type option is invoked as shown in chart 15 block of FIG. 2.

The two types of burst type options available for selection are sequential and interleave. Both sequential and interleave sequencing support bursts of 2, 4, and 8 cycles. Additionally, sequential sequencing supports the full-page length option.

The burst length is a programmable control operation feature defined by the op-code on address input pins A0–A2 in conjunction with the set mode register command. Address bits 2 through 0 define the burst length and are shown in chart 10 of FIG. 2.

The burst length provides for a continuous flow of data starting at the specified memory location during a READ or a WRITE access. Burst length options of 2, 4, 8 or full-page cycles may be programmed.

Once the mode register of a typical SDRAM is programmed it takes many clock cycles to reprogram the mode register because all of the memory banks need to be in the inactive state. For example, if the mode register of the MT48LC2M8S1 was programmed to have a sequential burst type during initialization it would take 11 clock cycles to reprogram the mode register to an interleave burst type, see FIG. 4 which is a timing diagram depicting the many clock cycles necessary to reprogram the MT48LC2M8S1 of the related art. Similar problems are encountered when reprogramming the other control operation features of the mode register.

The JEDEC-defined standard requires the type of sequencing to be programmed to the mode register. Each time the type of sequencing needs to be changed, the program register must be reprogrammed. Several cycles of overhead are required each time the program register must be reprogrammed. Thus, changing the type of sequencing during operation results in a significant time penalty. Consequently there exists a need to minimize the time required to reprogram the mode register, thereby increasing the processing speed.

SUMMARY OF THE INVENTION

The invention is a method for initially programming a memory device to have a first control operating option in response to a first command and for reprogramming the memory device to have a second control operating option in response to a second command.

In one embodiment reprogramming occurs when a bank activate signal is present.

In a further embodiment a first information bit is latched to an output node of a latch circuit during initial programming and a second information bit is latched to the latch output node during reprogramming. The control operating option selected during initial programming and then during reprogramming is determined from a value of the first and second information bits respectively.

In yet a further embodiment a first programming signal is generated in response to an information bit to determine the control operating option selected during initial programming, and the value of the first programming signal is toggled to generated a second programming signal for determining the control operating option selected during reprogramming.

The method of the invention minimizes the time required to reprogram the mode register since the method does not require the memory device to return to an original state before reprogramming occurs. A separate command controls reprogramming rather than the command which controls initial programming. Thus the method of the invention increases the processing speed of the memory device.

DETAILED DESCRIPTION OF THE INVENTION

Figure 1:
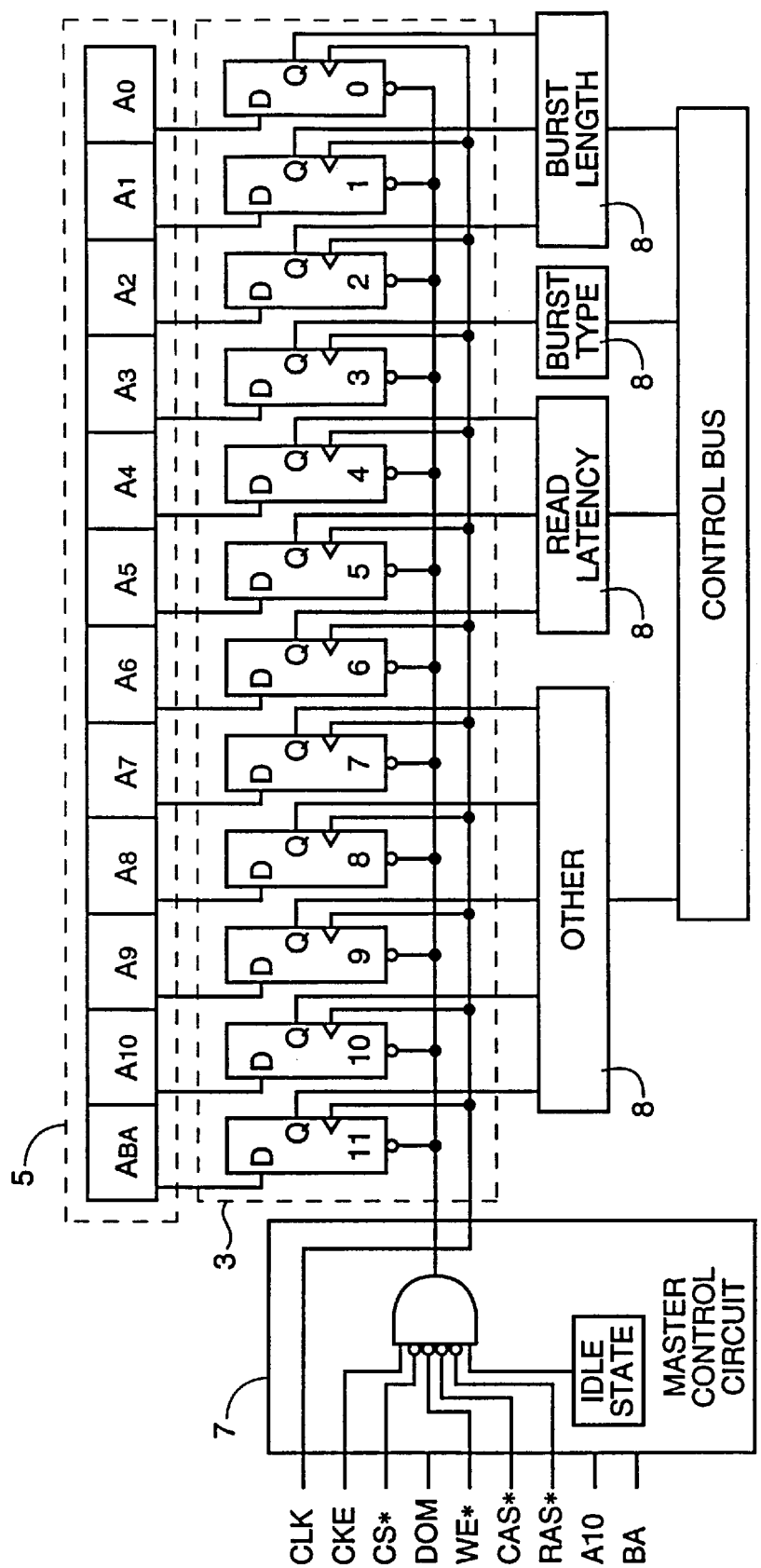
FIG. 1 is a block schematic representation of a mode register and programming circuitry of the related art.
Figure 2:
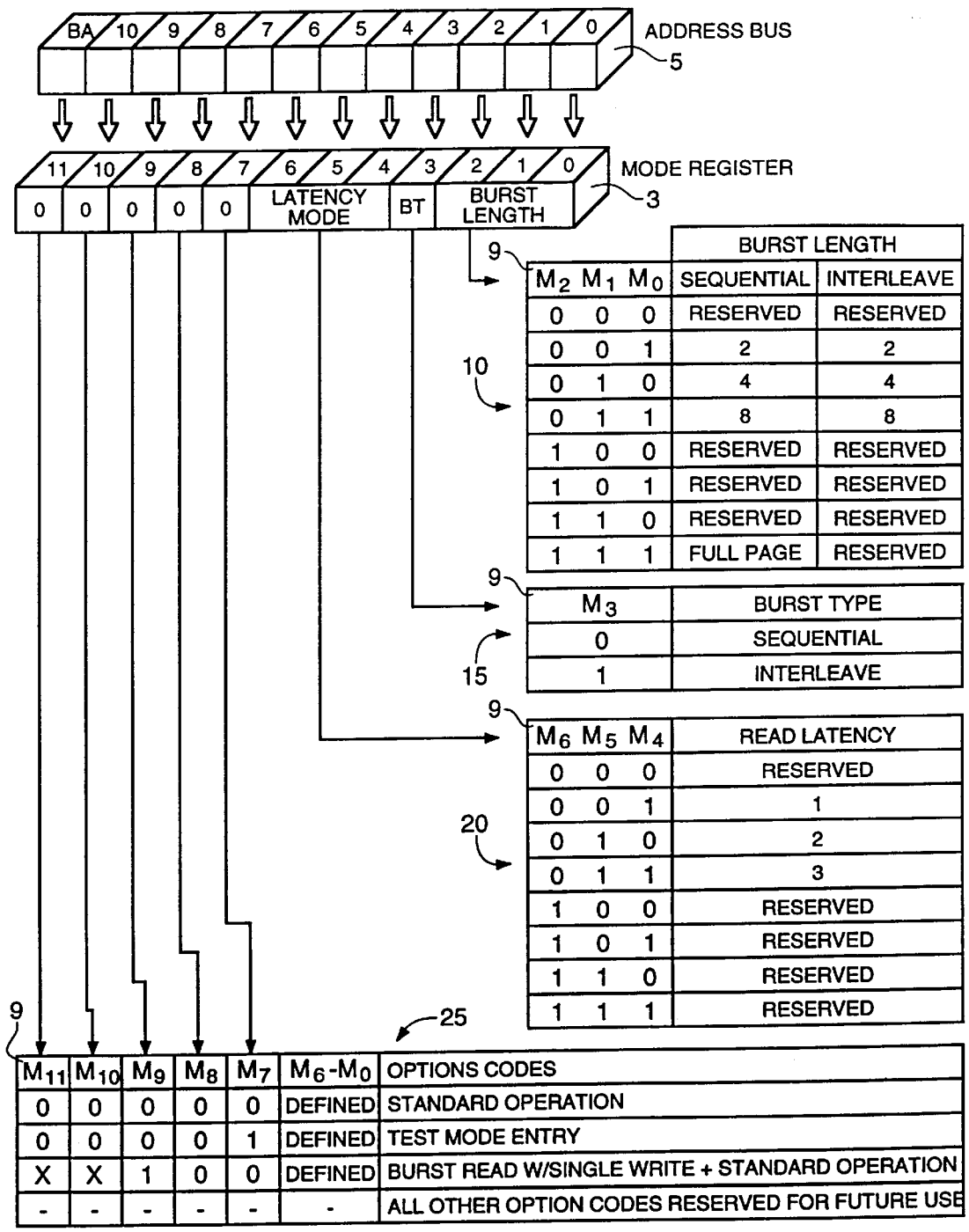
In FIG. 2 a chart exists for each of the programmable control operation features of the related art. Each chart describes the control operating options available for each programmable control operation feature and shows the values the mode register outputs must have in order to select each of the control operating options.
Figure 3:
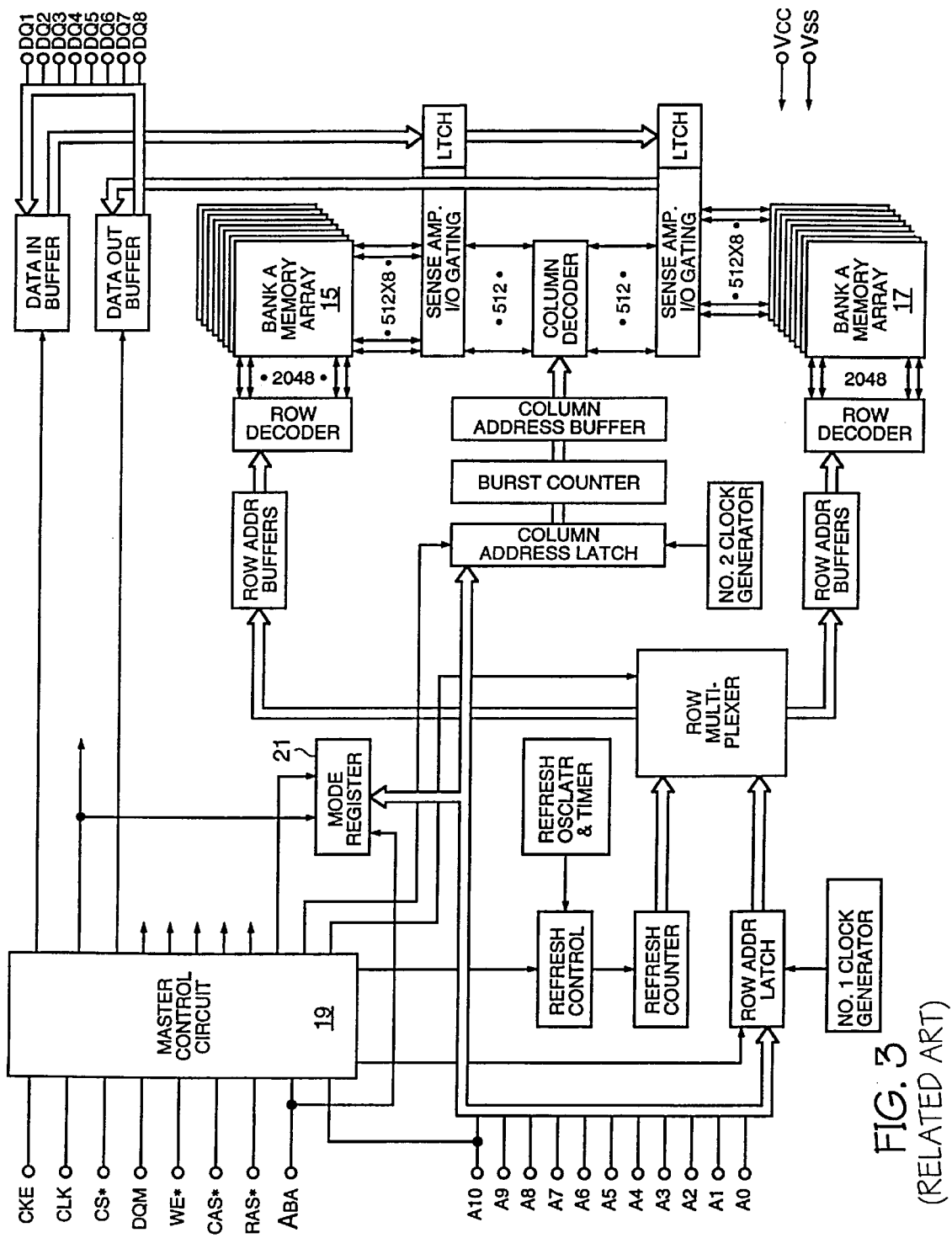
FIG. 3 is a block schematic representation of a synchronous dynamic random access memory device (SDRAM) of the related art.
Figure 4:
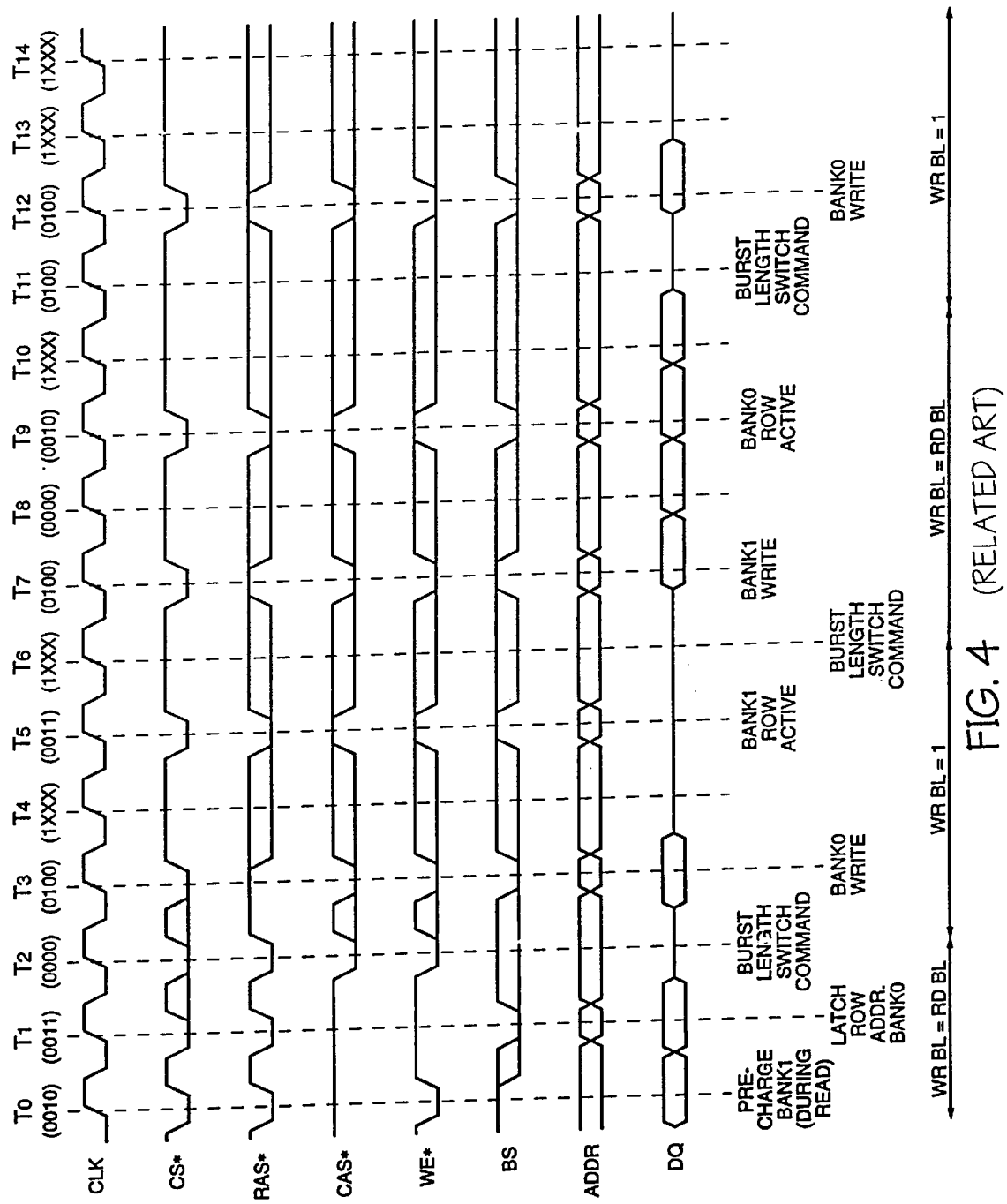
FIG. 4 is a timing sequence depicting the many clock cycles necessary to reprogram a mode register of the related art.

Where electrical functions and connections are described, it is understood that it is possible, within the scope of this invention, to use equivalent circuits to perform the described functions. Likewise, two electrical components which are connected may have interceding components which physically separate the two components. "Connected" is therefore intended to include components which are in electrical communication despite intervening components.

The invention is a synchronous dynamic random access memory (SDRAM) device having circuitry for programming a control operation feature into the SDRAM upon initialization of the SDRAM at start up and for reprogramming the control operation feature during normal operation of the SDRAM. The reprogramming occurs in the idle state in response to an activate row command (shown as ARC in the drawings) or during an active cycle when an active bank activate signal is present. Typically the active bank activate signal is generated internally in response to the activate row command. In the SDRAM of the invention the active bank activate signal is generated when any internal RAS* signal is low. In this discussion the active cycle refers to an SDRAM which has at least one memory bank in an active state or at least one memory bank being activated by an active bank activate signal.

Figure 5:
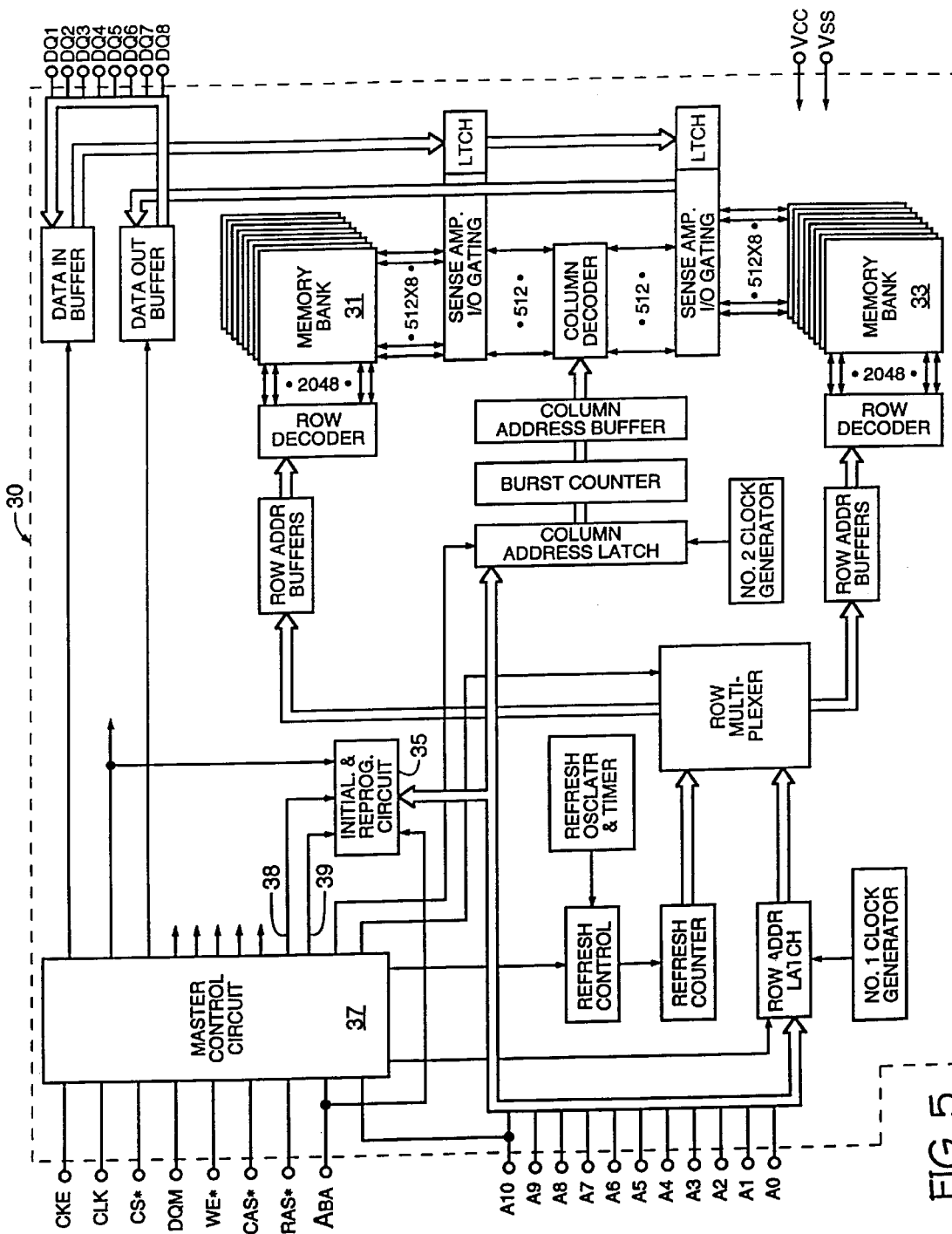
FIG. 5 is a block schematic of an SDRAM of the invention.

FIG. 5 is a simplified block diagram of one SDRAM 30 of the invention. The SDRAM 30 is a 2 Meg×8 having two memory banks 31 and 33. Each memory bank 31 and 33 has eight memory arrays. Each memory array is comprised of 1,048,576 memory storage cells for storing electrical data. An initialization and reprogramming circuit 35 receives at least two control signals from a master control circuit 37. The master control circuit 37 receives memory commands and generates internal control signals to control the operation of the memory device in response to the memory commands. The control signals generated by the master control circuit 37 and received by the initialization and reprogramming circuit 35 control the initialization and reprogramming of a control operation feature to have a desired control operating option, also known as a control operating mode. The operating mode initially selected is dependent on an operational code (op-code), or potential, on at least one of the address input pins A0–A10 and BA.

In the SDRAM of FIG. 5 all input and output signals, with the exception of the clock enable (CKE) signal, are synchronized to the system's clock (CLK). The positive going edge of the system clock provides the registering trigger which synchronizes the SDRAM.

Once the SDRAM is initialized it may be accessed. Each byte is uniquely accessed by registering the 11 row-address bits (A0–A10) via the active row command, followed by registering the 9 column-address bits (A0–A8) via a read/write command. Internal bank selection is controlled by the internal active bank activate signal generated in the master control circuit 37. The internal bank selection occurs during row address strobe (RAS) registration which allows the bank to be accessed in order that the read/write operation may be performed to the bank. The occurrence of a column address strobe registration initiates the actual read/write access. Bank selection is also called activation of the bank. The bank selected is referred to as an active bank.

The SDRAM 30 is reprogrammed when a bank is active or during the actual read/write access. The reprogramming occurs in response to at least the two control signals generated at output nodes 38 and 39 in the master control circuit 37.

When the control signal at output node 38 is active it is known as the set mode register command (shown as SMRC in the drawings) and is generated by the master control circuit 37 by an external set mode register command defined by chip select (CS*), row address strobe (RAS*), column address strobe (CAS*) and write enable (WE*) registered LOW during the idle state when the clock is enabled. During the idle state none of the memory banks are active and the bank activate signal is inactive. During the idle state initialization is performed in response to the set mode register command.

There are at least three embodiments of the circuit of FIG. 5. In all three embodiments the burst type is the control operation feature initialized and reprogrammed by the circuit and method of the invention. In all three embodiments the burst type operating options are the sequential option and the interleave option. The desired burst type operating option is determined by the op-code on address bit A3 during initialization. Both sequential and interleave sequencing support bursts of 2, 4, and 8 cycles. Additionally, sequential sequencing supports the full-page length option.

In all three embodiments an internal control state machine in the master control circuit 37 monitors control commands to determine when all of the memory banks are idle or inactive and to determine when at least one memory bank is active or the bank activate signal is active. When all of the memory banks are inactive the internal control state machine generates an idle state signal at a first control state machine output node, and when the bank activate signal is active the internal control state machine generates an active state signal at a second control state machine output node. Circuits which function as internal control state machines are well known to those skilled in the art.

In a first embodiment reprogramming is persistent. A reprogramming command, wherein SC* is low, RAS* is low, CAS* is low, and WE* is high, is issued before the read/write cycle occurs. The control operation feature is reprogrammed in response to the reprogramming command. During persistent reprogramming once the control operation feature has been reprogrammed from a first operating option to a second operating option, the SDRAM operates according to the second operating option until reprogrammed by the reprogramming command.

In a second embodiment the reprogramming is non-persistent. That is, once the control operation feature has been reprogrammed from a first operating option to a second operating option, the control operation feature automatically returns to the first operating option from the second operating option after the current access cycle. The operating option selected during reprogramming in the second embodiment is valid only during the current access cycle, that is until another CAS* registration occurs. The reprogramming operation lasts only for one burst sequence, independent of address. If the change is desired to last, through multiple burst sequences the reprogramming command, CS* low, RAS* low, CAS* low and WE* High, must be issued before each new column address is issued.

In the third embodiment an unused address input pin, in this case A9, accepts an op-code during CAS time. The op-code on A9 determines the operating option of the control operation feature during reprogramming.

FIGS. 6–10 are more detailed schematics of a portion of the SDRAM shown in FIG. 5 for the afore mentioned embodiments. The circuits of FIGS. 6–10 have similar components and functions. These similarities will be discussed at this time. Common components are numbered the same in FIGS. 6–10. The circuitry detailed in the master control circuit 37 is a portion of the total circuitry in the master control circuit 37 and is pertinent to the circuitry of the invention. The initialization and reprogramming circuit 35 comprises 12 D-flip-flops, D0–D11, which form a mode register 51. When the internal control state machine 53 generates an idle state signal at the first control state machine output node 55 and when the CKE is high and CS*, WE*, CAS* and RAS* are low the master control circuit 37 generates the set mode register command at output node 38 of NAND logic gate 59. The set mode register command is an enable signal for the mode register 51 and enables all of the D-flip-flops, D0–D11. When the D-flip-flops are enabled, the potential on each address input pin A0–A10 and ABA is latched to a corresponding D-flip-flop output node in response to the system clock transitioning high. In all three embodiments the output of D3 is used to determine whether the sequential or interleave operating option is programmed in the burst type programming circuit 61.

Figure 6:
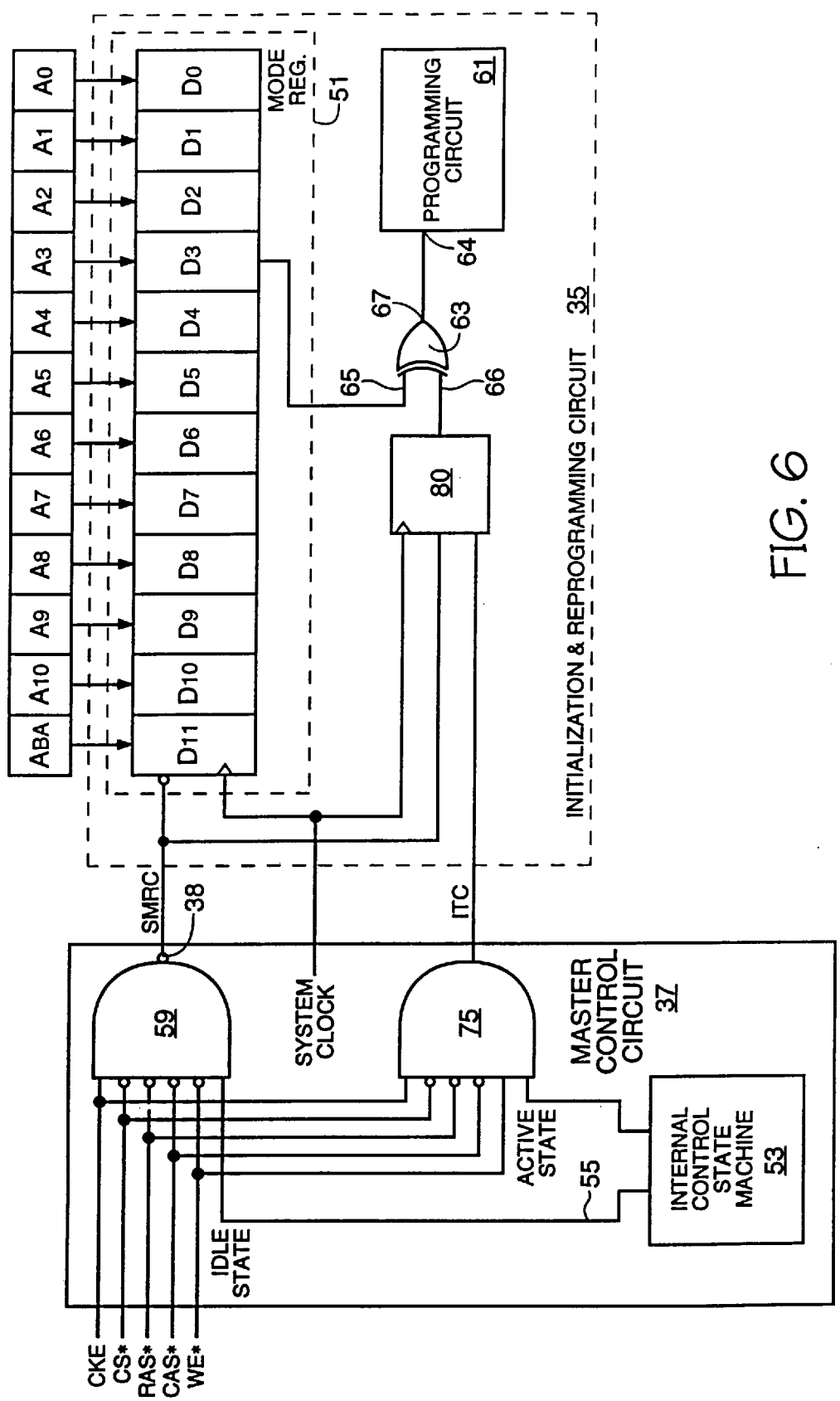
FIG. 6 is a block schematic representation depicting a portion of the circuitry of the master control circuit and depicting the initialization and reprogramming circuit of a first embodiment of the invention.
Figure 7:
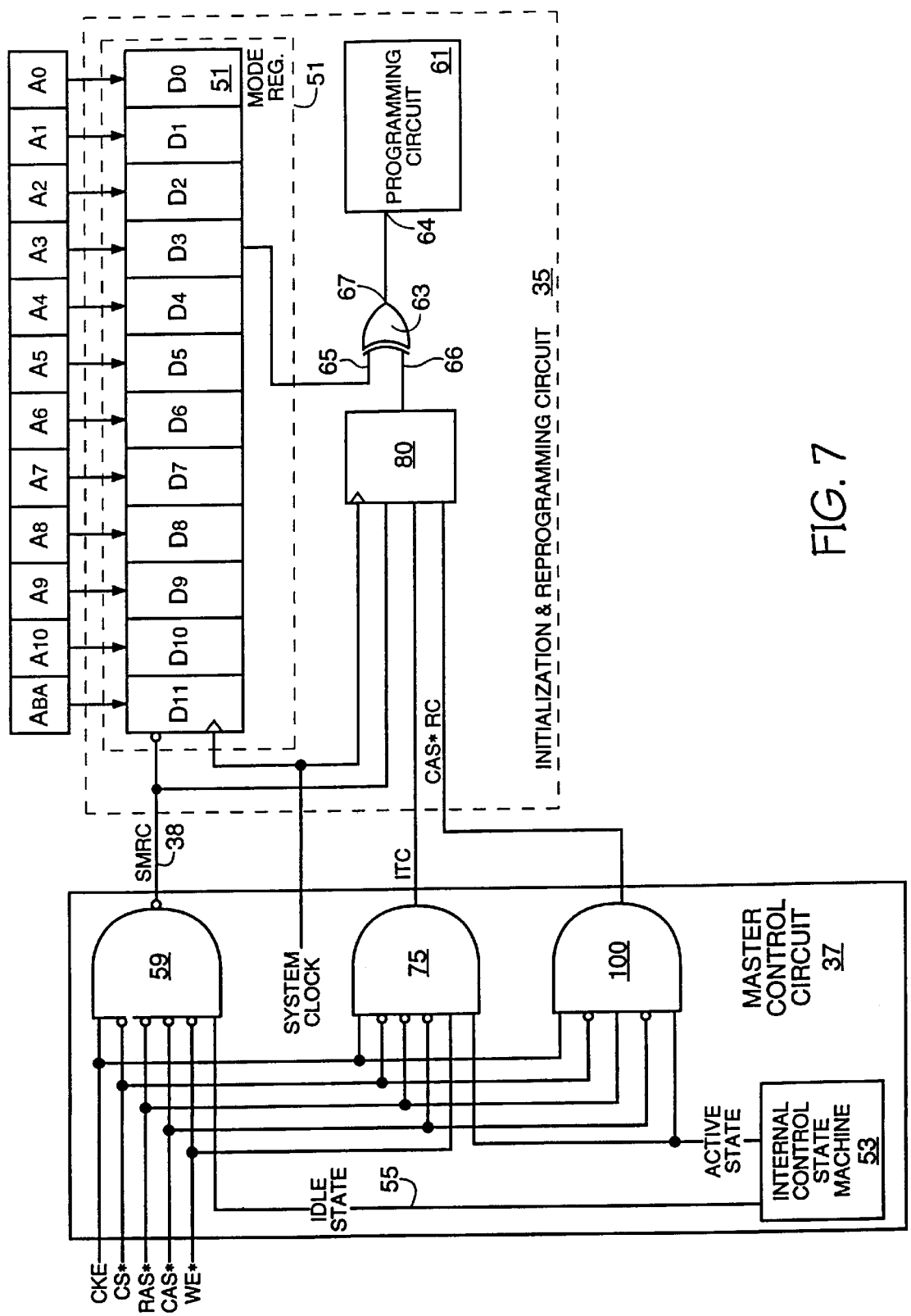
FIG. 7 is a block schematic representation depicting a portion of the circuitry of the master control circuit and depicting the initialization and reprogramming circuit of a second embodiment of the invention.
Figure 8:
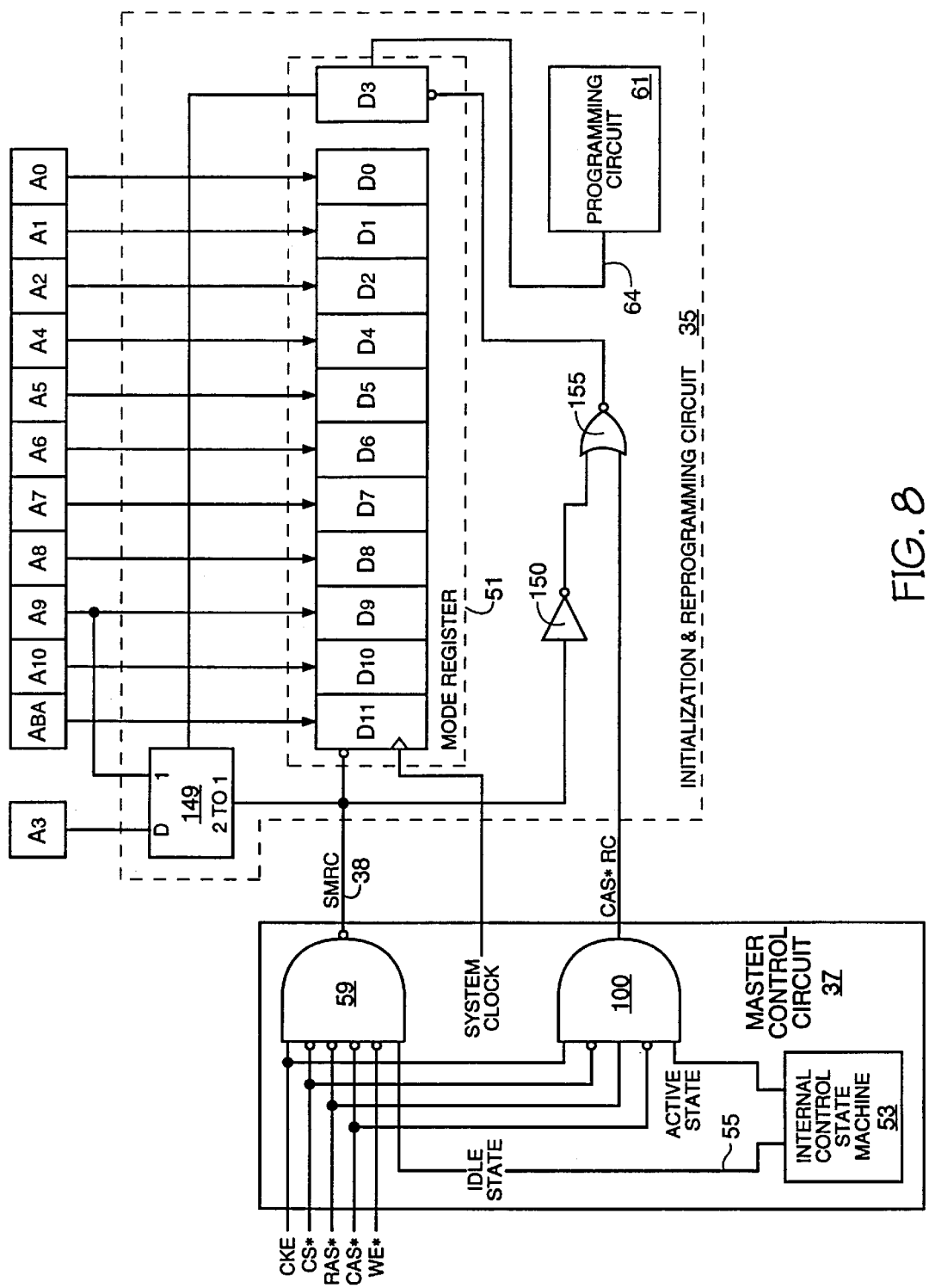
FIG. 8 is a block schematic representation depicting a portion of the circuitry of the master control circuit and depicting the initialization and reprogramming circuit of a third embodiment of the invention.

In the circuits of FIGS. 6 and 7 the output of D3 is an input to an exclusive OR logic gate 63, while in the circuit of FIG. 8, the output of D3 is directly connected to the input node 64 of the burst type programming circuit 61. Referring again to FIGS. 6 and 7, the output of the exclusive OR logic gate 63 is connected to the input node 64 of the burst type programming circuit 61. During initialization the exclusive OR logic gage 63 is enabled, and the output potential of the exclusive OR logic gate 63 is the same as the output potential of D3.

Perhaps the initialization of the SDRAM of FIGS. 6 and 7 can be understood best when presented in terms of an example. Assume the potential on A3 has a high logic state, then a potential having a high logic state is latched to the output node of D3 and to the input node 65 of the exclusive OR logic gate 63. The exclusive OR logic gate 63 is enabled by a low potential on input node 65. In the example the output potential at output node 67 has a high logic state. The burst type programming circuit responds to the high potential and programs an interleave burst to the SDRAM. Conversely when the potential on A3 has a low logic state a potential having a low logic state appears at output node 67 and the burst type feature is programmed to have a sequential burst by the burst type programming circuit 61.

In the circuit of FIG. 8 the output node of D3 is directly connected to the input node 64 of the burst type reprogramming circuit 61. The potentials on A3 and A9 are multiplexed to the input of D3 such that during initialization A3 is the input of D3 and during reprogramming A9 is the input of D3. Thus the potential on A3 determines the burst type feature during initialization, and the potential on A9 determines the burst type feature during reprogramming.

The circuits of FIGS. 6 and 7 have some commonalities with respect to the reprogramming of the burst type feature of the invention. In both cases the enable signal on input node 66 changes state during reprogramming. This causes the output potential of the exclusive OR logic gate 63 to toggle to the opposite logic state. When the output potential at output node 67 toggles the burst type programming circuit responds by programming the opposite operating option for the burst type feature. Therefore if the SDRAM had been initialized to have a sequential burst, the SDRAM is reprogrammed to have an interleave burst and vice versa. The reprogramming performed in the circuit of FIG. 6 is persistent, that is, the SDRAM continues to operate according to the reprogrammed burst type feature until reprogrammed. The reprogramming performed in the circuit of FIG. 7 is non-persistent, that is, the SDRAM returns to the initial operating option after the current access cycle. In both cases an internal toggle command (shown as ITC in the drawings) is responsible for changing the state of the enable signal on input node 66 of the exclusive OR logic gate 63 and is generated in an AND logic gate 75 in the master control circuit 37. In both cases the AND logic gate 75 generates the internal toggle command in response to CS*, RAS*, and CAS* having a low logic state, and We*, the CKE signal, and the active state signal having a high logic state. The internal toggle command is an input to an intermediate logic circuit 80 and is clocked to the input of the exclusive OR logic gate by the system clock. The combination of CS* low, RAS* low, CAS* low and WE* high, and CKE constitutes an external toggle command. The external toggle command is combined with the internally generated active state signal to form the internal toggle command.

Figure 9:
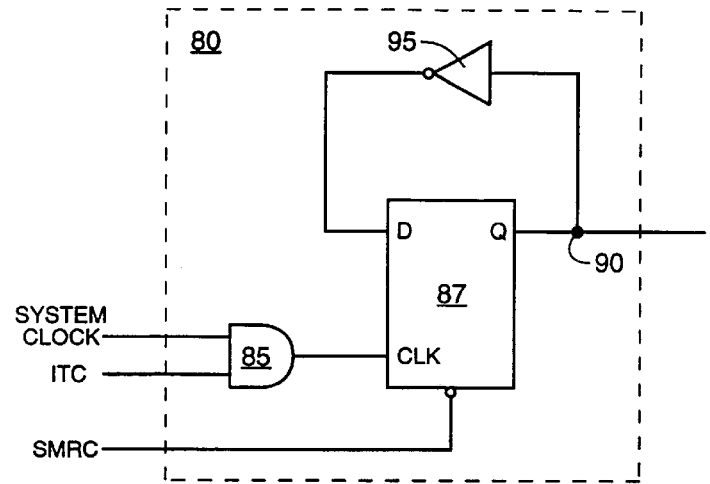
FIG. 9 is a detailed schematic of the logic circuitry of FIG. 6.

FIG. 9 is a more detailed schematic of the intermediate logic circuit 80 of FIG. 6. The system clock and the internal toggle command are inputs to an AND logic gate 85. The output of AND logic gate 85 clocks a D-flip-flop 87, which was initially reset to have a low potential on output node 90 during initialization in response to the low set mode register command. Output node 90 is connected to exclusive OR input node 66 of FIG. 6. The output potential at output node 90 is inverted by inverter 95 such that when the D-flip-flop is clocked by the output of the AND logic gate 85 the output potential at output node 90 changes state, and the value of the potential on the output node 67 of the exclusive OR logic gate 63 also changes state. The value of the potential of the output node 67 remains unchanged until the next external toggle command initiates reprogramming. Thus the reprogramming is persistent.

Looking again at FIG. 7. An AND logic gate 100 in master control circuit 37 provides a CAS* registration command (shown as CAS*RC in the drawings) to intermediate logic circuit 80. The intermediate logic circuit 80 responds to the CAS* registration command by generating a signal which results in the burst type programming circuit 61 programming the operating option that was originally programmed during initialization. The CAS* registration command is also used to latch the column address and WE* state for a read/write command. The AND logic gate 100 generates the CAS* registration command in response to the internally generated active state signal from the internal control state machine 53 in conjunction with the externally controlled CKE, CAS* RAS*, and CS* signals. The states of CKE, RAS*, CS*, and CAS* must be High, High, Low, and Low, respectively.

Figure 10:
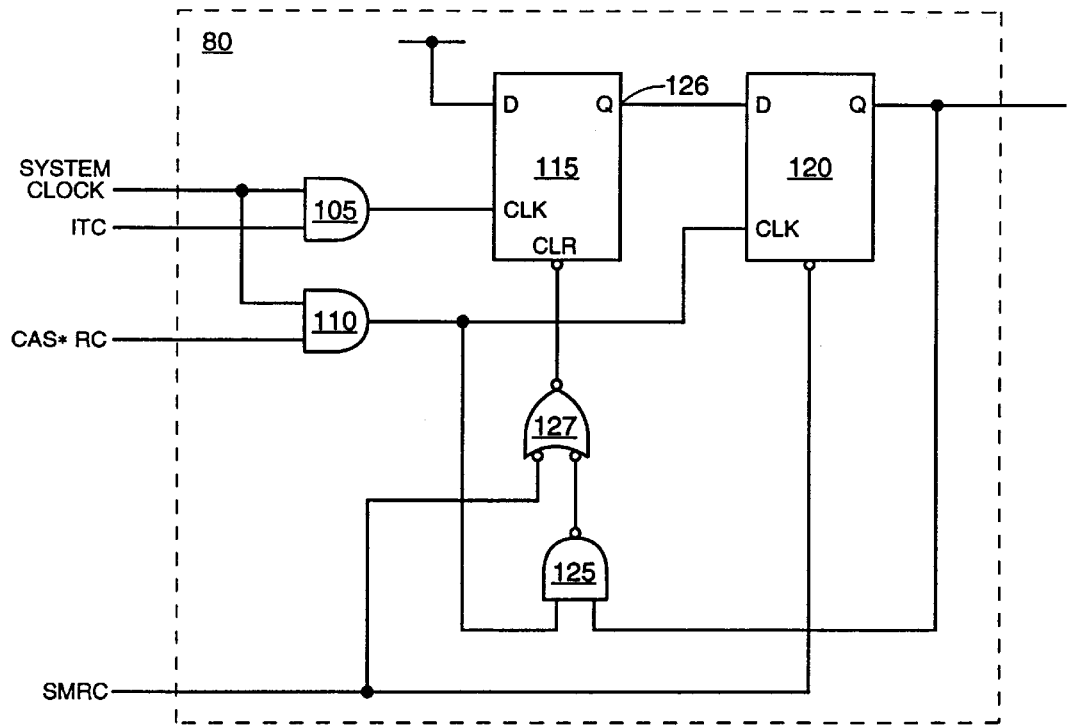
FIG. 10 is a detailed schematic of the logic circuitry of FIG. 7.

FIG. 10 is a more detailed schematic of the intermediate logic circuit 80 of FIG. 7. The intermediate logic circuit 80 comprises two AND logic gates 105 and 110, both having the system clock as one input signal, two D-flip flops 115 and 120, a NAND logic gate 125, and a negative nor logic gate 127. AND logic gate 105 receives the internal toggle command as a second input signal, and AND logic gate 105 provides the clock signal to D-flip-flop 115. The input node of D-flip-flop 115 is connected to a supply potential, typically $V_{CC}$. The output signal of D-flip-flop 115 is an input signal to D-flip-flop 120. AND logic gate 110 receives the CAS* registration command as a second input signal, and AND logic gate 110 provides the clock signal to D-flip-flop 120. The output signal of D-flip-flop 120 is an input signal at input node 66 of exclusive OR logic gate 63. D-flip-flops 115 and 120 are initially reset in response to set mode register command in order that the exclusive OR logic gate 63 is enabled for initialization. The output signal of D-flip-flop 120 and the output signal of AND logic gate 110 are the input signals to NAND logic gate 125.

D-flip-flop 115 is used to indicate that a toggle command has occurred, since the toggle command can occur while a burst read or write operation is in process. D-flip-flop 120 uses the output of D-flip-flop 115 (toggle command occurred) as the input which determines whether or not to toggle the burst type for the ensuing read/write operation. A toggle command affects only the next read/write operation which is defined by the next occurring CAS* registration command. This allows the toggle command to set the burst sequence once for the full burst sequence. The D-flip-flop 115 allows the circuit to remember that a toggle command has occurred since the last CAS* registration command. D-flip-flop 115 sets up the burst sequence for the next read/write operation while the current operation is in process.

During initialization the output potentials of both D-flip-flop 120 and AND logic gate 110 have low logic states, and the output potential of NAND logic gate 125 has a high logic state. When an external toggle command is applied to AND logic gate 75 of the master control circuit 37 the internal toggle command is available on one input of the AND logic gate 105. The output of AND logic gate 105 then goes high when the system clock goes high clocking the D-flip-flop 115, which then latches a potential having a high logic state to its output. When the D-flip-flop 120 is clocked, the high potential on output node 126 is clocked to the output of D-flip-flop 120, and the output of the exclusive OR logic gate 63 toggles to the opposite state. The burst type programming circuit responds to the toggle and reprograms the SDRAM for the opposite operating option. Now a high potential appears at both NAND logic gate 125 inputs and the NAND 125 logic gate output potential goes to a low logic state resetting the D-flip-flop 115, taking output node 126 to a low potential. This state corresponds to a "no pending toggle" state. The low potential on output node 126 is clocked to the output of D-flip-flop 120 during the next CAS* registration command, the output of the exclusive OR logic gate 63 toggles back to its original logic state, and the burst type programming circuit 61 programs the SDRAM to the operating option programmed during initialization. The SDRAM remains programmed to the operating option initially programmed until an external toggle command reprograms the burst type feature again. After reprogramming the circuit of FIG. 7, the next CAS* registration command will return the burst type feature mode to the operating mode programming during initialization. Thus reprogramming the burst type feature of the SDRAM of FIG. 7 is non-persistent since it only lasts for one burst operation. However, the circuit allows for issuing the reprogramming command while a burst operation is in process. This eliminates any interruption in data flow from the SDRAM.

Figure 11:
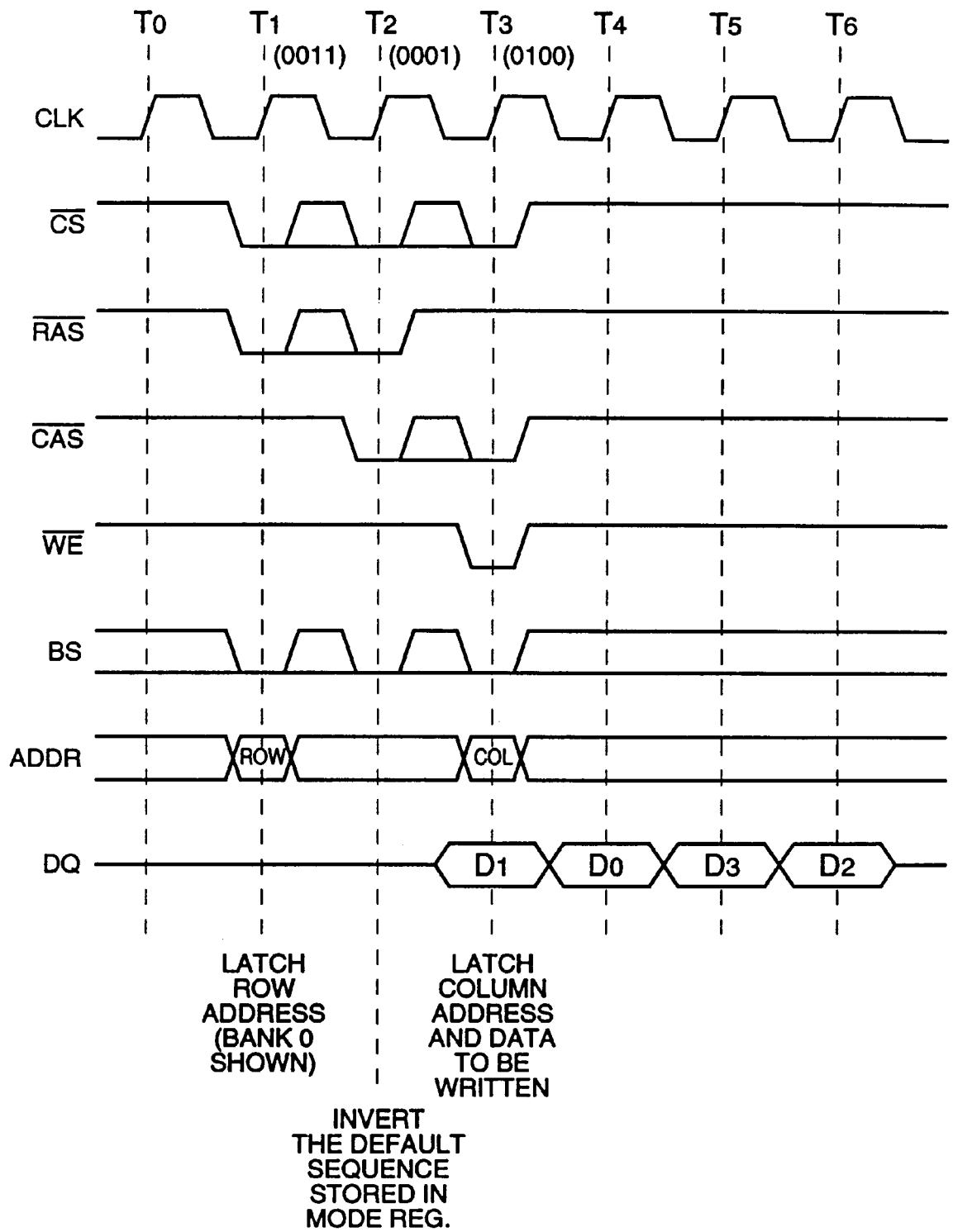
FIG. 11 is a timing sequence depicting clock cycles using the control operation reprogramming feature of the circuit of FIG. 7 during a write cycle.

FIG. 11 is a timing sequence depicting the clock cycles necessary to reprogram a control operation feature of the circuit of FIG. 7 during a write cycle.

Figure 12:
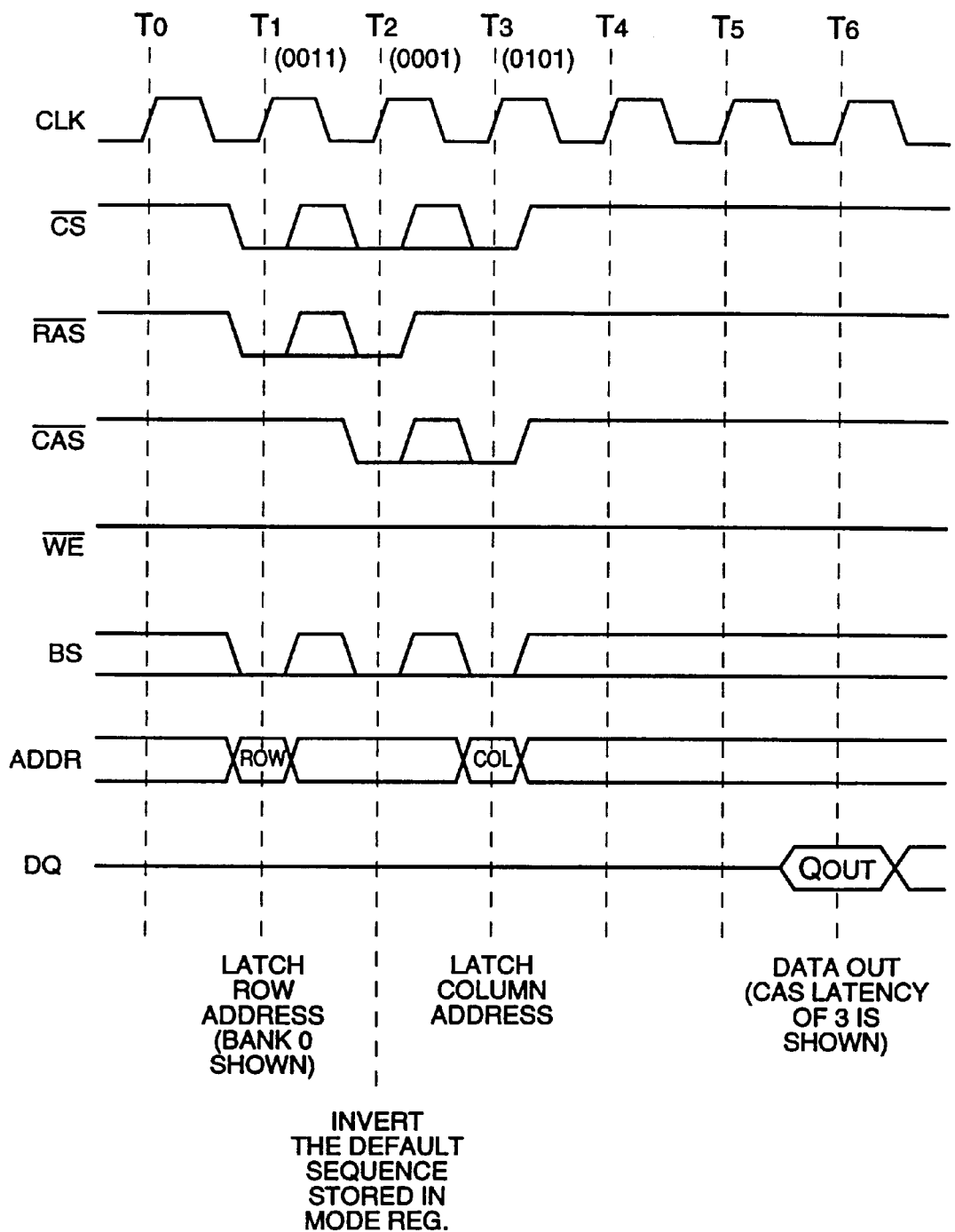
FIG. 12 is a timing sequence depicting clock cycles using the control operation reprogramming feature of the circuit of FIG. 7 during a read cycle.

FIG. 12 is a timing sequence depicting the clock cycles necessary to reprogram a control operation feature of the circuit of FIG. 7 during a read cycle.

In the circuit of FIG. 8 an op-code is presented to the mode register 51 during initialization and each CAS* registration command following initialization. The op-code is multiplexed from external address bits A3 and A9 to the input of D3. As was stated previously NAND logic gate 59 enables the mode register 51 with a set mode register command. In addition the output of the NAND logic gate 59 controls multiplexer 149. During initialization a low NAND gate output multiplexes the op-code on external address A3 to the input of D3, and during a CAS* registration command a high NAND gate output multiplexes the op-code on external address A9 to the input of D3. The set mode register command enables all of the D-flip-flops directly except D3. D3 is enabled during initialization when the set mode register command is inverted by inverter 150 to the input of an enabled NOR logic gate 155. The NOR logic gate 155 converts the high potential from inverter 150 during the initial mode registration command to a low potential on its output which enables D-flip-flop D3. During a state other than idle the output of NAND logic gate 59 transitions high disabling all of the D-flip-flops of the mode register 51 except for D3. The high potential is inverted by inverter 150 and enables the NOR logic gate 155. During each CAS* registration command the output potential of AND logic gate 100 has a high logic state. The enabled NOR logic gate 155 inverts the high logic state to enable D3 during each CAS* registration command. Since the op-code on A9 is multiplexed to D3 during the CAS* registration command the burst type feature for each CAS* registration command is determined by the value of the op-code on A9. Thus the circuit of FIG. 8 can be reprogrammed during each CAS* registration command by changing the value of the op-code on A9. The op-code on A3 determines the burst type feature during initialization only.

Figure 13:
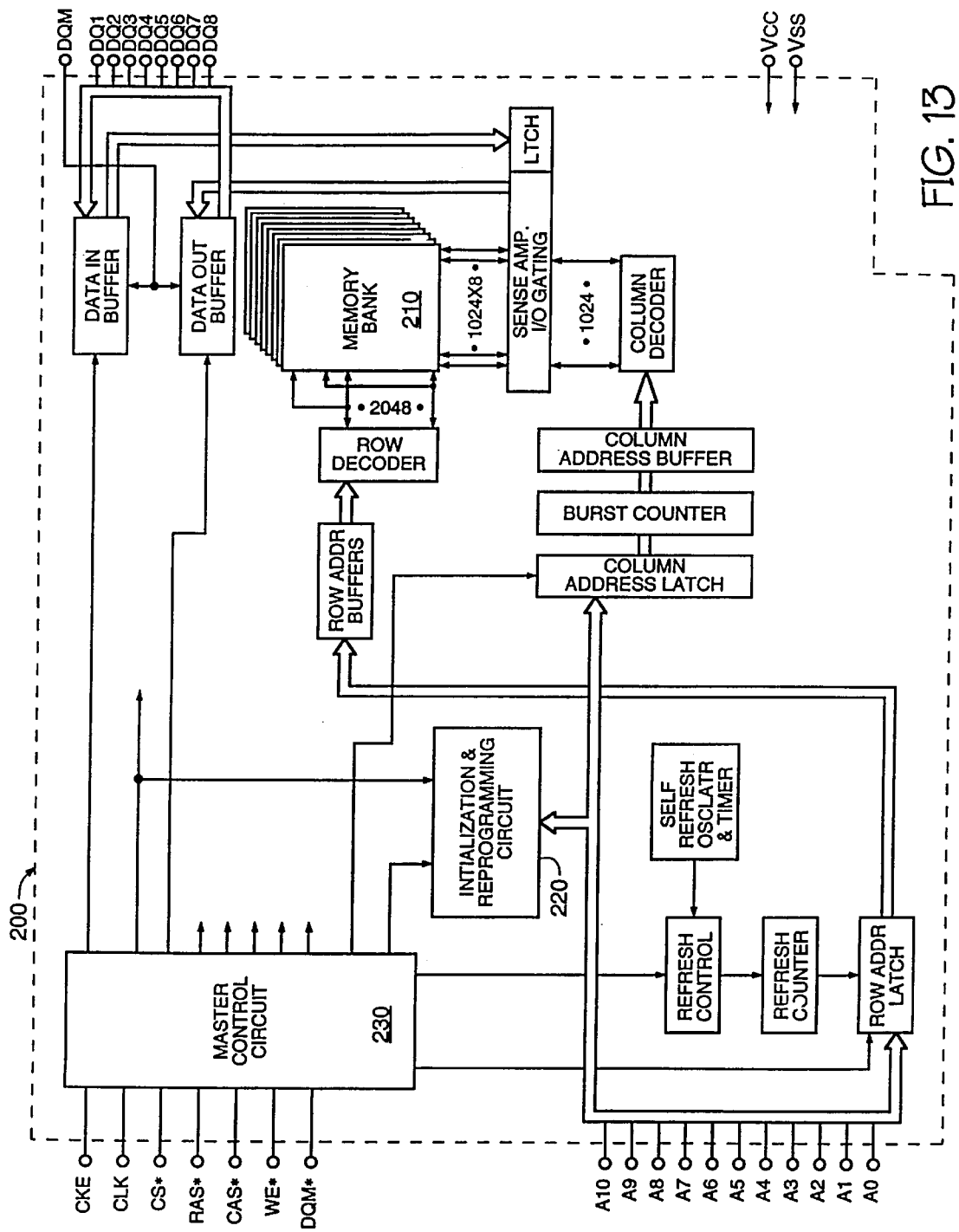
FIG. 13 is a block schematic of an SDRAM of a fourth embodiment of the invention.

FIG. 13 is a simplified block diagram of a further SDRAM 200 of the invention. SCRAM 200 is a 2 meg×8 having one memory bank 210. The memory bank has eight memory arrays. Each memory array is comprised of 2,097,152 memory storage cells for storing electrical data. An initialization and reprogramming circuit 220 receives at least two internal control signals generated in a master control circuit 230. The master control circuit 230 receives memory commands and generates internal control signals to control the operation of the SDRAM in response to the memory commands. The two internal control signals generated by the master control circuit 230 and received by the initialization and reprogramming circuit 220 control the initializing and reprogramming of an operation feature to have a desired operating option. The circuit and method of the present embodiment pertains particularly to the initialization and reprogramming of the burst type operation feature. The operating option initially selected is dependent on an op-code, or potential, on at least one of the address input pins A0–A10.

In the SDRAM of FIG. 13 all input and output signals, with the exception of the CKE signal, are synchronized to the CLK. The positive going edge of the system clock provides the registering trigger which synchronizes the SDRAM.

Once the SDRAM is initialized it may be accessed. Each byte is uniquely accessed by registering the 11 row-address bits (A0–A10) via the Active command, followed by registering the 9 column-address bits (A0–A8) via a read/write command. The occurrence of a CAS* registration initiates the actual read/write access. The bank is accessed in response to a low RAS*.

Figure 14:
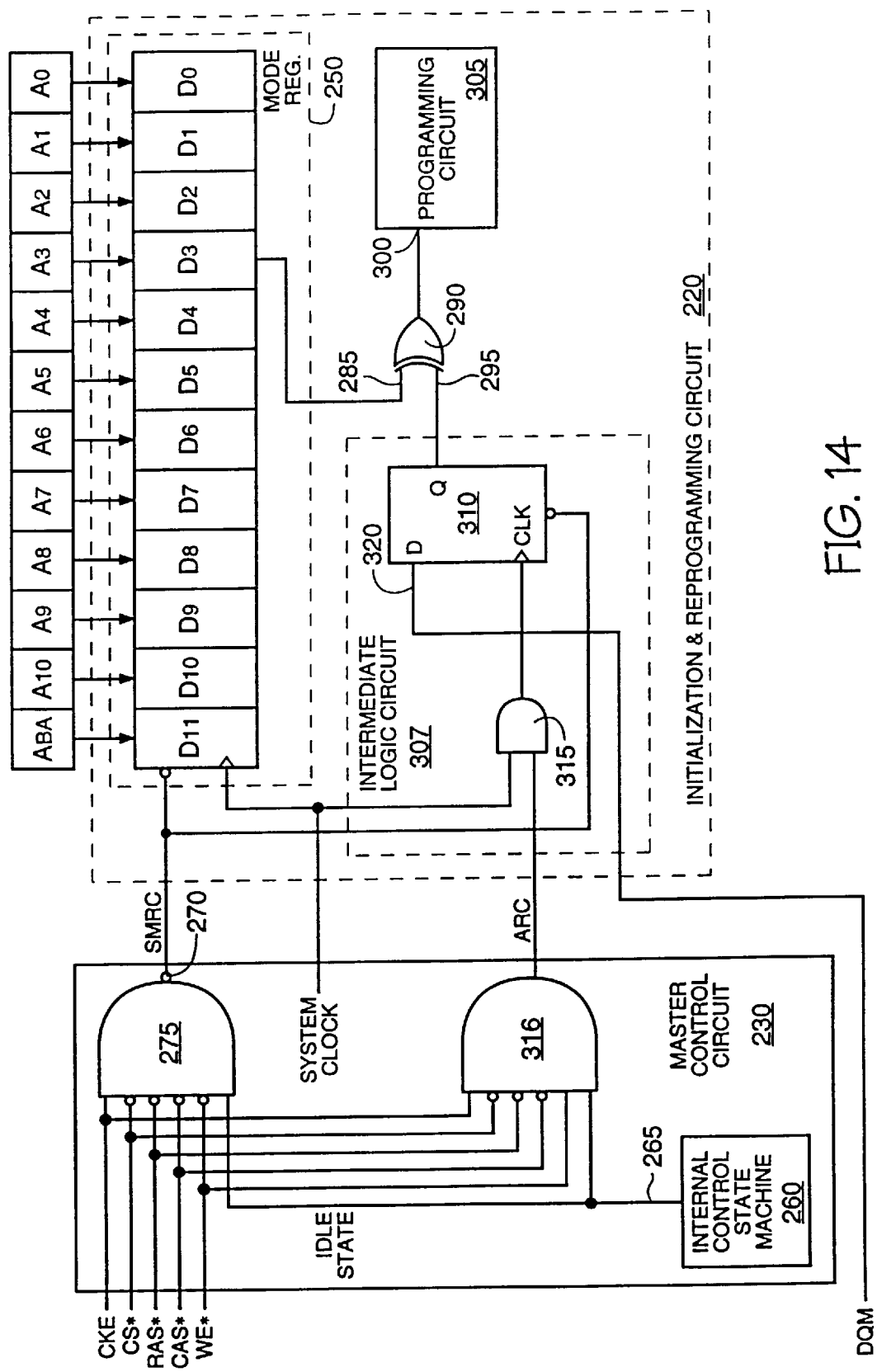
FIG. 14 is a schematic representation depicting a portion of the circuitry of the master control circuit of FIG. 13 and depicting the initialization and reprogramming circuit of the circuit of FIG. 13.

FIG. 14 is a more detailed circuit of a portion of the SDRAM 200 of FIG. 13. The circuitry shown in the master control circuit 230 is a portion of the total circuitry in the master control circuit 230 and is pertinent to the circuitry of the invention. The initialization and reprogramming circuit 220 comprises 12 D-flip-flops, D0–D11, which form a mode register 250. When the internal control state machine 260 generates an idle state signal at the control state machine output node 265 and when the CKE is high and CS*, WE*, CAS* and RAS* are low the master control circuit 230 generates the set mode register command at output node 270 of NAND logic gate 275. The internal control state machine 260 is similar to the internal control state machine 53 described with respect to the first three embodiments. The set mode register command is an enable signal for the mode register 250 and enables all of the D-flip-flops, D0–D11. When the D-flip-flops are enabled, the potential on each address input pin A0–A10 is latched to a corresponding D-flip-flop output node in response to the system clock transitioning high.

The output signal of D3 is latched to a first input node 285 of an exclusive OR logic gate 290. The exclusive OR logic gate 290 is enabled during initialization by a low potential on node 295. Therefore the output signal on D3 is passed to the input node 300 of the burst type programming circuit 305. The burst type programming circuit 305 responds to the signal on input node 300 to determine whether the sequential or interleave operating option is programmed for the burst type operation feature.

An intermediate logic circuit 307 comprises a D-flip-flop 301 and an AND gate 315. The D-flip-flop 310 is reset during initialization, in response to the set mode register command at output node 270, to provide the exclusive OR logic gate enable signal at input node 295.

Unlike the previous three embodiments wherein the circuit could be reprogrammed at the initiation of every read/write command, the circuit of the present embodiment can only be reprogrammed in response to the activate row command which occurs when the CKE, CAS* and We are high, when CS* and RAS* are low and during the presence of an idle state signal at control state machine output node 265, in this case a high. AND gate 315 supplies a high to the D-flip-flop 310 in response to the activate row command generated in logic gate 316 and a high system clock.

When the output signal of AND gate 315 transitions high it clocks D-flip-flop 310. A signal applied to the DQM input 320 becomes the input signal to the D-flip-flop 310 and is responsible for reprogramming the control operation feature of the SDRAM when clocked to the Q output which is connected to input node 295.

The value of the signal on the DQM input 320 is externally controlled to effect the desired reprogramming of the SDRAM. When the signal on the DQM is low the exclusive OR gate 290 remains enabled and the SDRAM operates according to the control operating option programmed during initialization. To reprogram the burst type operation feature to an operating option not selected during initialization the signal on DQM must have a high potential when the D-flip-flop 310 is clocked. The high on input 320 is then clocked to the Q input and to input 295. The high on input 295 of the exclusive OR gate 290 causes the output potential of the exclusive OR gate to toggle to the opposite logic state. Therefore the input potential at input node 300 toggles and the burst type programming circuit responds by programming the opposite operating option for the burst type feature. Therefore if the SDRAM had been initialized to have a sequential burst, the SDRAM is reprogrammed to have an interleave burst when the signal on DQM is high and when AND gate 315 clocks D-flip-flop 310. When the signal on DQM is low the operating option returns to the option selected during initialization in response to an active activate row command.

The actual number of memory banks present in the SDRAMs of the invention is not limited to the examples cited. For example, although SDRAM 30 of FIG. 5 has been shown having two memory banks 31 and 33 the embodiments of the invention described with respect to FIG. 5 may have more memory banks or only a single memory bank, and although the SDRAM 200 of FIG. 13 has been shown having only one memory bank the invention described with respect to FIG. 13 may have multiple memory banks.

Thus the invention is a means for reprogramming a control operation feature into a memory device during a CAS* registration command or during a activate row command thereby eliminating the time requirements previously required to cycle the memory device to a idle-state in order to re-initialize the memory device. Although the description of the invention, as described herein, was directed to reprogramming a burst type operation feature of an SDRAM, the invention is equally applicable for other control operation features initialized at start up and reprogrammed without returning to the original idle state of the SDRAM. The invention is also applicable to memory devices other than SDRAM which are initially programmed to have a desired control operation feature and which are reprogrammed during normal operation.

It can be seen from the numerous embodiments of the invention that the reprogramming circuitry and method of the invention may vary as far as the actual method of reprogramming and as far as the actual circuit implementation used to effect the reprogramming. It can also be seen that there are several options available with regard to persistent and non-persistent reprogramming. Accordingly the invention should be read as limited only by the claims.

What is claimed is:

1. A method for operating a memory device, comprising the following steps:

a) providing a first command to the memory device;

b) providing a selection signal to the memory device;

c) programming a control operation feature of the memory device in response to said first command to have one of a plurality of operating options as determined by said selection signal;

d) providing a second command to the memory device; and e) toggling a value of said selection signal from a first logic state to a second logic state in response to said second command in order to reprogram said control operation feature of the memory device to have a further one of said plurality of said operating options.

2. A method for operating a memory device, comprising the following steps:

a) providing a first command to the memory device;

b) providing a selection signal to the memory device;

c) programming a control operation feature of the memory device in response to said first command to have one of a plurality of operating options as determined by said selection signal;

d) providing a second command to the memory device;

e) toggling a value of said selection signal from a first logic state to a second logic state in response to said second command in order to reprogram said control operation feature of the memory device to have a further one of said plurality of said operating options;

f) providing a third command to said memory device; and g) toggling a value of said selection signal from said second logic state to said first logic state in response to said third command.

* * * * *